(12) United States Patent
Kawasumi

(10) Patent No.: US 7,034,577 B2
(45) Date of Patent: Apr. 25, 2006

(54) VARIABLE TIMING CIRCUIT

(75) Inventor: Atsushi Kawasumi, Austin, TX (US)

(73) Assignee: Kabushiki Kaisha Toshiba, Tokyo (JP)

( * ) Notice: Subject to any disclaimer, the term of this patent is extended or adjusted under 35 U.S.C. 154(b) by 53 days.

(21) Appl. No.: 10/903,258

(22) Filed: Jul. 30, 2004

(65) Prior Publication Data

US 2006/0022715 A1    Feb. 2, 2006

(51) Int. Cl.
*H03K 19/20* (2006.01)
*H03K 19/173* (2006.01)
*H03K 19/00* (2006.01)
*G06F 7/38* (2006.01)

(52) U.S. Cl. .......................... 326/104; 326/37; 326/38; 326/93

(58) Field of Classification Search ................ 326/104, 326/37, 38, 93; 713/400, 401
See application file for complete search history.

(56) References Cited

U.S. PATENT DOCUMENTS

| | | | |
|---|---|---|---|
| 5,053,996 A | | 10/1991 | Slemmer |
| 5,497,019 A | * | 3/1996 | Mayer et al. ................ 257/347 |
| 6,473,334 B1 | | 10/2002 | Bailey et al. |
| 6,888,202 B1 | | 5/2005 | Kang et al. |
| 6,934,896 B1 | * | 8/2005 | Larson et al. ................ 714/724 |
| 2002/0020886 A1 | | 2/2002 | Rockett |

FOREIGN PATENT DOCUMENTS

| | | |
|---|---|---|
| JP | 283782 | 7/1990 |
| JP | 6-291282 | 10/1994 |

OTHER PUBLICATIONS

Kang, Won-Gu et al: "A Novel Body-tied Silicon-On-Insulator (SOI) n-channel Metal-Oxide-Semiconductor Field-Effect-Transistor with Grounded Body Electrode" ETRI Journal vol. 7, No. 4, Jan. 1996.*
Bernstein et al; SOI Circuit Design Concepts;SOI Timing Variability; Chapter 8.7; Kluwer Academic Publishers, no date.

* cited by examiner

*Primary Examiner*—Don Le
*Assistant Examiner*—Jason Crawford
(74) *Attorney, Agent, or Firm*—Law Offices of Mark L. Berrier

(57) ABSTRACT

Systems and methods for delaying a signal by a selectable amount of time, wherein the selectable amount of time is adjustable in relatively small increments and wherein the variability of the selectable amounts of time is minimized. One embodiment comprises a circuit formed by a plurality of silicon-on-insulator (SOI) logic gates. The logic gates form a plurality of signal paths through the circuit, each of which imparts a corresponding delay to a signal routed through the path. Each of the signal paths includes a common portion formed by body-tied logic gates that imparts a fixed portion of the total signal delay, and a selectable portion formed by floating-body logic gates that imparts a selectable portion of the total signal delay. The circuit thereby reduces variations in the delay and also provides relatively small incremental changes in the selectable amount delay.

19 Claims, 5 Drawing Sheets

VARIABLE TIMING CIRCUIT

BACKGROUND

1. Field of the Invention

The invention relates generally to the field of electronic circuits and more particularly to systems and methods for improving the structure and operation of variable timing circuits that are constructed using silicon-on-insulator (SOI) technology.

2. Related Art

There are times when it is useful in an electrical circuit to be able to delay a signal by a variable amount of time. For example, if a particular circuit is activated by the overlap of pulses in two different received signals, it may be desirable to control the timing of at least one of the signals in order to control the overlap of the pulses and thereby control the activation of the circuit. The variable delay can be implemented, for instance, in a logic circuit such as that one depicted in FIG. 1.

Referring to FIG. 1, a diagram illustrating the design of an exemplary variable-delay circuit in accordance with the prior art is shown. Variable delay circuit 100 consists of Variable delay circuit 100 consists of a set of inverters and NAND gates that are configured to delay a signal received on input line 161 by a variable amount of time and to provide the delay output signal on output line 162. The amount of time by which the received signal is delayed is dependent upon a set of select signals that are also input to circuit 100.

Depending upon which of the select signals is asserted, the signal input on line 161 is passed through a fixed set of logic components, and potentially through one or more additional sets of logic components. These components correspond to a "fixed" portion and a variable portion of the total delay through circuit 100. Thus, if signal select2 is asserted (and signals select1 and select0 are de-asserted,) the signal input on line 161 passes through inverters 111 and 112, NAND gates 123 and 151, and inverters 152 and 153 before being output on line 162 with the minimum, "fixed" delay. If signal select1 is asserted (and signals select2 and select0 are de-asserted,) the signal input on line 161 passes through inverters 111 and 112, NAND gates 122 and 141, inverter 142, NAND gate 151 and inverters 152 and 153 before being output on line 162. In this instance, the total delay consists of the "fixed" delay, plus the delay through the two additional logic gates, 141 and 142. If signal select0 is asserted (and signals select1 and select2 are de-asserted,) the signal input on line 161 passes through inverters 111 and 112, NAND gates 121 and 131, inverter 132, NAND gate 141, inverter 142, NAND gate 151 and inverters 152 and 153 before being output on line 162. In this case, the total delay consists of the "fixed" delay, the additional delay incurred with the assertion of select1, and the delay corresponding to two additional logic gates, 131 and 132.

Typically, it is desirable to increase the speed, including circuits that include variable-delay circuits such as the one described above. One way to achieve this goal is to use silicon-on-insulator (SOI) technology to manufacture the circuits. Transistors that are manufactured using SOI technology can be faster than transistors that are constructed directly on a silicon substrate. Logic gates that are built with these transistors, hence the circuits that use these logic gates, can therefore also be smaller and faster than their non-SOI counterparts.

The use of SOI technology can have drawbacks, however. For example, because the transistors are built on an insulating substrate, the bodies of the transistors typically "float." The body voltages of the transistors may therefore be different at different times. For example, if a transistor is coupled to a node that may alternately be at Vdd or at ground, the body voltage of the transistor may be pulled toward the node voltage. The body voltage will therefore typically be somewhere between the high and low voltages that can be present at the node to which the transistor is coupled. Because, in a logic circuit, the voltage at the node may vary irregularly between high and low values corresponding to binary data values that are represented by the node over time, the body voltage of the transistor is dependent on the history of the voltages at the node. In other words, the body voltage of the transistor is dependent upon the history of the node. This is referred to as the history effect.

The fact that SOI-based transistors may be subject to the history effect is important because the threshold voltage of each transistor varies with the body voltage of the transistor. This, in turn, is important because the response of the transistor (e.g., the delay with which the transistor switches) varies with the threshold voltage of the transistor. The transistor response is therefore dependent, to some extent, upon the previous state (the history) of the circuit in which it is used. Thus, the response of SOI components of a variable-delay circuit such as the one described above may have varying responses that result in variations in the delays that can be selected for the circuit.

SUMMARY OF THE INVENTION

One or more of the problems outlined above may be solved by the various embodiments of the invention. Broadly speaking, the invention comprises systems and methods for delaying a signal by a selectable amount of time, wherein the selectable amount of time is adjustable in relatively small increments and wherein the variability of the selectable amounts of time is minimized.

One embodiment comprises a circuit that is formed by a plurality of silicon-on-insulator (SOI) logic gates. The logic gates form a plurality of signal paths through the circuit. Each of the signal paths imparts a corresponding delay to the signal when the signal is routed through the respective path. Each of the signal paths includes a common portion that imparts a fixed portion of the total signal delay. Each of the signal paths also includes a selectable portion that imparts a selectable portion of the total signal delay. The common portion of the signal paths is formed by body-tied logic gates in order to reduce variations in the fixed portion of the delay. The selectable portions of the signal paths are formed by floating-body logic gates in order to provide relatively small incremental changes in the selectable portion of the delay.

In one embodiment, the common portion of the signal paths includes only body-tied logic gates, while in other embodiments, both body-tied and floating-body logic gates can be used. In one embodiment, the selectable portion of the signal paths includes only floating-body logic gates, while in other embodiments, both floating-body and body-tied gates can be used. In one embodiment, each successive signal path includes most or all of the preceding signal path and adds one or more additional logic gates to provide the additional incremental delay. In one embodiment, the logic gates added in each successive signal path are of the same number and type, although this is not necessarily the case.

Numerous additional embodiments are also possible.

The various embodiments of the invention may provide a number of advantages over the prior art. For instance, prior art variable-delay circuits that employ all floating-body logic gates have a substantial amount of variability in the lengths of the delay as a result of the history effect. The use of body-tied logic gates in place of some of the floating-body logic gates reduces this variability. On the other hand, prior art variable-delay circuits that employ all body-tied logic gates do not provide small incremental changes in the lengths of the selectable delays. The use of floating-body logic gates in providing the selectable portion of the delay allows the size of the incremental delays to be reduced for finer-grained control of the delay. Still further advantages may be apparent to those of skill in the art.

BRIEF DESCRIPTION OF THE DRAWINGS

Other objects and advantages of the invention may become apparent upon reading the following detailed description and upon reference to the accompanying drawings.

Figure 1:
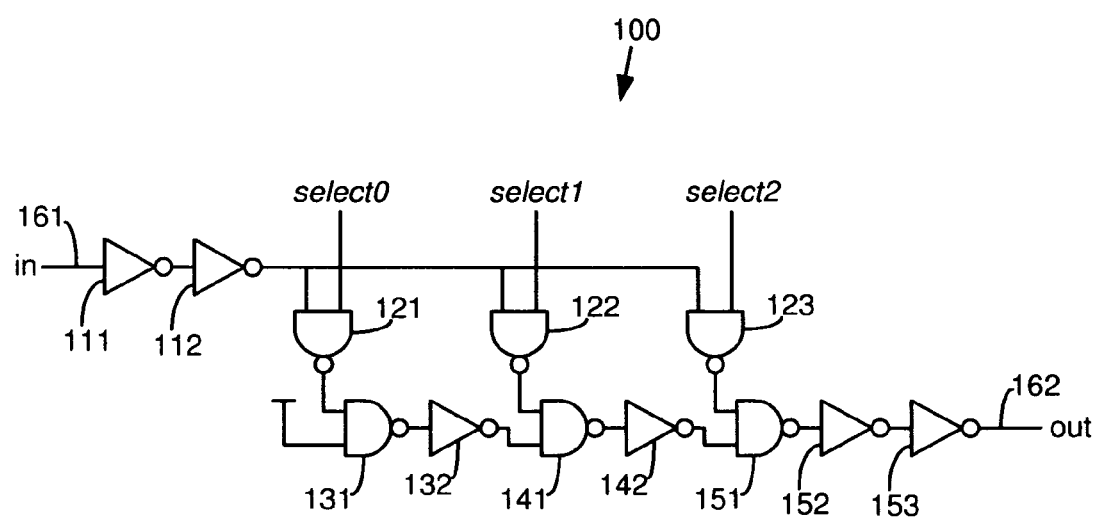
FIG. 1 is a diagram illustrating the design of an exemplary variable-delay circuit in accordance with the prior art.

While the invention is subject to various modifications and alternative forms, specific embodiments thereof are shown by way of example in the drawings and the accompanying detailed description. It should be understood, however, that the drawings and detailed description are not intended to limit the invention to the particular embodiments which are described. This disclosure is instead intended to cover all modifications, equivalents and alternatives falling within the scope of the present invention as defined by the appended claims.

DETAILED DESCRIPTION OF PREFERRED EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for delaying a signal by a selectable amount of time, wherein the selectable amount of time is adjustable in relatively small increments and wherein the variability of the selectable amounts of time is minimized.

One embodiment comprises a circuit that is formed by a plurality of silicon-on-insulator (SOI) logic gates. The logic gates form a plurality of signal paths through the circuit. Each of the signal paths imparts a corresponding delay to the signal when the signal is routed through the respective path. Each of the signal paths includes a common portion that imparts a fixed portion of the total signal delay. Each of the signal paths also includes a selectable portion that imparts a selectable portion of the total signal delay. The common portion of the signal paths is formed by body-tied logic gates in order to reduce variations in the fixed portion of the delay. The selectable portions of the signal paths are formed by floating-body logic gates in order to provide relatively small incremental changes in the selectable portion of the delay.

In one embodiment, the common portion of the signal paths includes only body-tied logic gates, while in other embodiments, both body-tied and floating-body logic gates can be used. In one embodiment, the selectable portion of the signal paths includes only floating-body logic gates, while in other embodiments, both floating-body and body-tied gates can be used. In one embodiment, each successive signal path includes most or all of the preceding signal path and adds one or more additional logic gates to provide the additional incremental delay. In one embodiment, the logic gates added in each successive signal path are of the same number and type, although this is not necessarily the case.

Referring again to FIG. 1, the logic gates of variable-delay circuit 100 are configured to provide three different, selectable paths that can be traversed by a signal to go from input line 161 to output line 162. Each of these paths includes a set of common logic gates. Specifically, these common logic gates include inverters 111 and 112, NAND gate 151 and inverters 152 and 153. Because these logic gates are common to each of the three paths through circuit 100, they provide a fixed delay that is imparted to the signal, whether it traverses the first, the second or the third path through circuit 100.

Although no one of NAND gates 121, 122 and 123 is common to each of the three paths through variable-delay circuit 100, they may collectively be considered to be common to the three paths, since exactly one of them will be in each path, and the delay in imparted to the signal by each one of them will be approximately the same. This delay may be considered part of the fixed delay.

As noted above, the difference between each of the three paths through variable-delay circuit 100 is whether or not additional logic gates (aside from those that are common to all of the paths) must be traversed by the signal and, if so, how many of these logic gates must be traversed. When more gates must be traversed by the signal, additional delay is imparted to the signal. By adding the same number and type of logic gates to each succeeding path, the design of circuit 100 is intended to provide the capability of increasing the delay in imparted to the signal in equal increments with the selection of successive paths through the circuit. That is, by adding a NAND gate and an inverter to each successive path, an incremental delay equal to the delay of the NAND gate and the inverter is added to each successive path.

Figure 2:
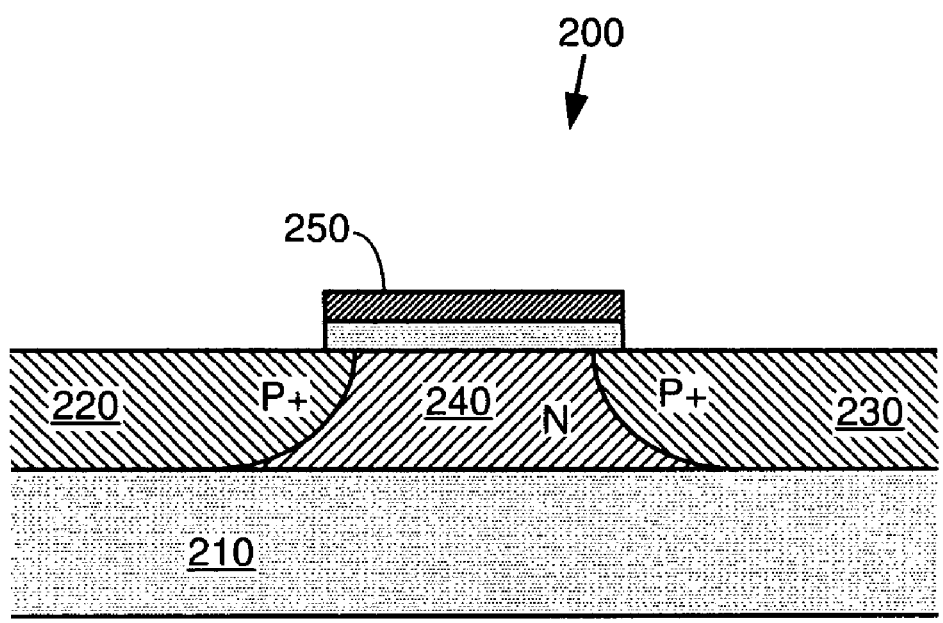
FIG. 2 is a diagram illustrating the structure of an exemplary silicon-on-insulator (SOI) transistor.

Problems with this design, however, arise when variable-delay circuit 100 is implemented using SOI technology. As noted above, "SOI" stands for "silicon on insulator." Referring to FIG. 2, a diagram illustrating the structure of an exemplary SOI transistor is shown. In this figure, it can be seen that transistor 200 is constructed by building up successive layers of materials (e.g., doped silicon) on a substrate of insulating material 210 (e.g., silicon dioxide.) Transistor 200 includes a source 220 and a drain 230 which are formed using P+-type material and a channel 240 that consists of N-type material. A gate 250 is formed above channel 240.

The structure of SOI transistor 200 differs from the structure of a typical bulk transistor in that it is constructed upon insulating substrate 210, rather than a silicon substrate. Any typical bulk transistor, the body (channel) of the transistor is electrically coupled to the silicon substrate so that, if the substrate is coupled to a particular voltage, the body of the transistor is also at that particular voltage. Because the body 240 of transistor 200 is built on an insulating substrate, the voltage of body 240 floats.

This results in both advantages and disadvantages of the SOI device, in comparison to the bulk device. Particularly, because the body of the SOI transistor floats, the transistor is faster than a comparable bulk transistor. This increase in speed is one of the primary reasons for using SOI devices. The fact that the body voltage floats, however, also gives rise to the disadvantage of being subject to the history effect. Because the body of the SOI transistor is not tied to a particular voltage, it may vary over time, according to the voltage is that are applied to the source and drain. The time-varying voltage of the body of the SOI transistor causes the threshold voltage of the transistor to vary, which in turn causes the response (e.g., the delay associated with the transistor) to vary.

If all of the components of circuit 100 are implemented using floating-body SOI devices, each of these devices is subject to the history effect. As described above, the history effect causes the devices to respond in a manner that varies with the state of the circuit. The variations of the successive components that must be traversed by a signal between the input and output lines may be cumulative. This may introduce a great deal of uncertainty in the magnitude of the total delay of the circuit.

While a typical SOI transistor is subject to the history effect, there is a way to eliminate this effect. The history effect can be eliminated by tying the body of the transistor to a particular voltage. This type of transistor may therefore be referred to as a "body-tied" transistor. In exemplary transistor 200 of FIG. 2, this could be accomplished by constructing a via (an electrical connection) from a node having a non-varying voltage to body 240. If the body of the SOI transistor is tied to a particular voltage, it can no longer vary. As a result, the threshold voltage of the transistor and the response of the transistor will no longer vary. Thus, the response of the transistor will not be dependent upon the history of the circuit in which it is used.

The disadvantage of tying the body of the SOI transistor to a particular voltage is that, because the transistor is no longer "floating," it is no longer as fast as a floating-body SOI transistor. Consequently, a logic gate which is constructed using body-tied SOI transistors is slower than a logic gate that is constructed using comparable floating-body transistors. The delay that is imparted to a signal which passes through a body-tied logic gate is therefore larger than the delay that is imparted by a floating-body logic gate.

Conventional circuits therefore used either floating-body SOI transistors to obtain the benefit of their speed, or body-tied SOI transistors to eliminate the disadvantage of the history effect. In the context of a variable-delay circuits such as the one shown in FIG. 1, this resulted in signal delays that had too much variability (if floating-body transistors were used,) or that had too little fine-grained control (if body-tied transistors were used.)

Embodiments of the present invention try to take advantage of both the lack of history effect in body-tied transistors and the speed of floating-body transistors. This is accomplished by using body-tied components to provide the fixed portion of the variable delay through the circuit and using floating-body components to provide the variable portion of the delay through the circuit. Because it is typically desired to have the fixed portion of the delay equal to or greater than the delay provided by a body-tied logic gate, there is no need to use a faster, floating-body logic gate (which would provide a smaller delay.) The use of body-tied components to provide the fixed portion of the delay therefore provides the advantage of eliminating the variability that would otherwise be contributed by floating-body components. On the other hand, it is typically desired to have finer-grained control over the incremental changes in the total delay through the circuit. Because floating-body logic gates can provide this finer-grained control (through shorter delay times per gate,) these gates are used to provide the variable portion of the total delay. Thus, the components that provide the fixed portion of the delay do not contribute to the variability in the total delay, and the components that provide the variable portion of the delay.

Figure 3:
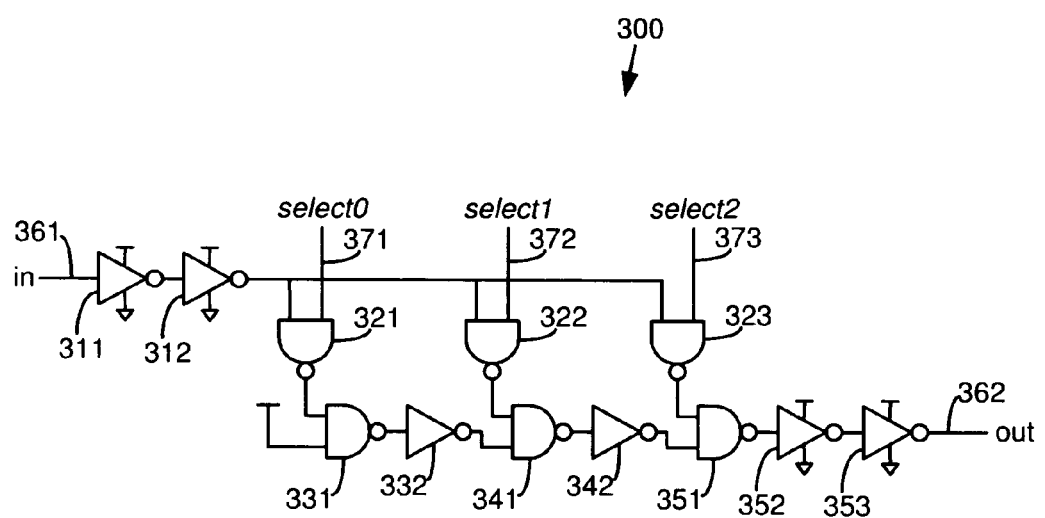
FIG. 3 is a diagram illustrating a variable-delay circuit in accordance with one embodiment.

Referring to FIG. 3, a diagram illustrating a variable-delay circuit in accordance with one embodiment is shown. As depicted in this figure, input line 361 is coupled to the input of inverter 311. The output of inverter 311 is coupled to the input of another inverter, 312. The output of inverter 312 is coupled to one of the inputs of each of NAND gates 321, 322 and 323. The second input of each of NAND gates 321, 322 and 323 is coupled to a corresponding one of control lines 371, 372 and 373. Select signals select0, select1 and select 2 are provided to NAND gates 321, 322 and 323, respectively, via control lines 371, 372 and 373.

The output of NAND gate 321 is coupled to one of the inputs to NAND gate 331. The other input of NAND gate 331 is coupled to a power supply voltage. The output of NAND gate 331 is coupled to the input of inverter 332. The output of NAND gate 322 is coupled to one of the inputs to NAND gate 341. The other input of NAND gate 341 is coupled to the output of inverter 332. The output of NAND gate 341 is coupled to the input of inverter 342. The output of NAND gate 323 is coupled to one of the inputs to NAND gate 351. The other input of NAND gate 351 is coupled to the output of inverter 342. The output of NAND gate 351 is coupled to the input of inverter 352. The output of inverter 352 is coupled to the input of inverter 353. The output of inverter 353 is coupled to output line 362.

The operation of variable-delay circuit 300 is essentially as follows. The input signal online 361 is passed through inverter 311 and inverter 312. The signal inversions performed by inverters 311 and 312 cancel each other, so these two components serve only to delay the signal. The delayed signal is then provided to each of NAND gates 321, 322 and 323. Only one of the select signals (select0, select1 and select2) is high, so only the corresponding one of NAND gates 321, 322 and 323 inverts the delayed signal (imparting an additional delay) and passes it through to the corresponding one of NAND gates 331, 341 and 351. Each of the other two NAND gates (of 321, 322 and 323) receives a low select signal, so the outputs of these two NAND gates are high.

The delayed, inverted signal is provided as an input to one of NAND gates 331, 341 or 351. The other input to this NAND gate is always high. The NAND gate and therefore inverts the signal again, delays it a bit more, and provides the now non-inverted signal to the corresponding one of inverters 332, 342 and 352. The signal is then passed through an even number of logic gates, each of which inverts the signal and imparts an additional delay. The number of logic gates through which the signal passes, hence the amount by which the signal is delayed, is dependent upon which have the select signals is asserted.

Whichever of the select signals is asserted, the input signal will always pass through inverters 311 and 312, one out of NAND gates 321, 322 and 323, and then through NAND gate 351 and inverters 352 and 353. These logic gates therefore define a "fixed" portion of the delay imparted by circuit 300. If signal select2 is asserted, this is the total delay through the circuit. If signal select1 is asserted, the total delay is equal to the "fixed" delay, plus the delay added by NAND gate 341 and inverter 342. If signal select0 is asserted, the total delay is equal to the "fixed" delay, plus the delay added by NAND gates 341 and 351, and inverters 342 and 352.

Figure 4A:
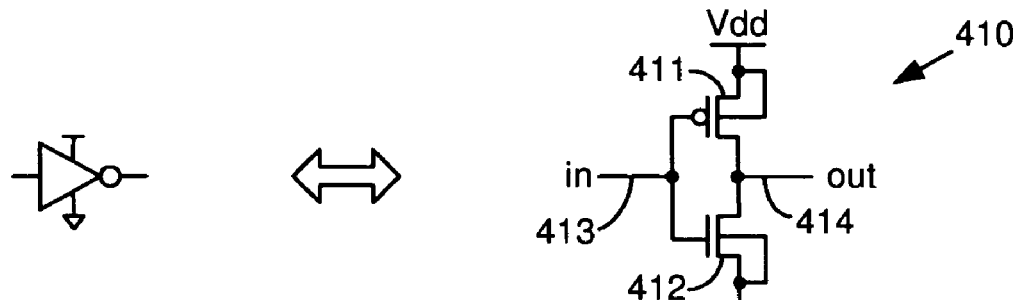
FIGS. 4A–4C are a set of diagrams illustrating the structure of the various logic gates used in circuit 300.
Figure 4B:
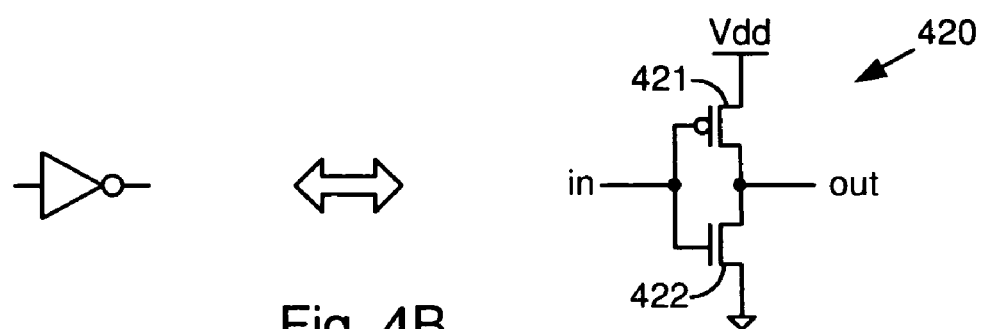
Figure 4C:
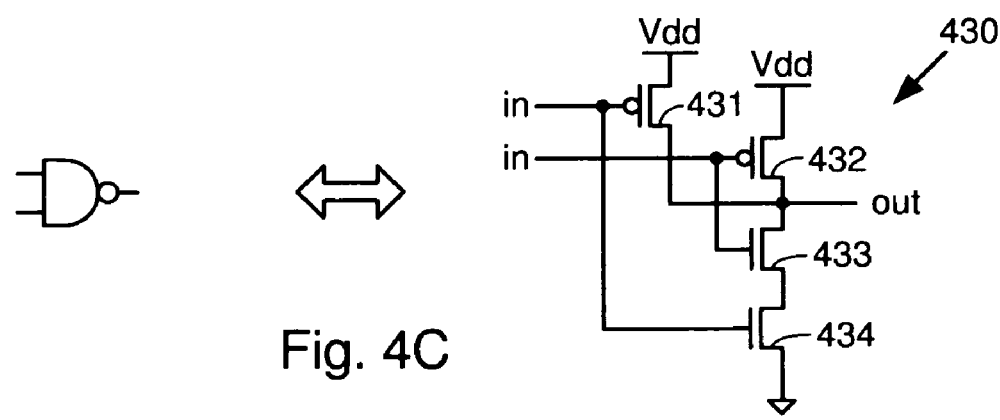

Referring to FIGS. 4A–4C, a set of diagrams illustrating the structure of the various logic gates used in circuit 300 are shown. FIG. 4A illustrates the structure of a body-tied inverter, while FIG. 4B illustrates the structure of a floating-body inverter, and FIG. 4C illustrates the structure of a floating-body NAND gate.

Referring to FIG. 4A, body-tied inverter 410 consists of a pair of interconnected transistors, 411 and 412. The source of PMOS transistor 411 is coupled to a power supply, while the drain of this transistor is coupled to the output, 414, of the inverter. The gate of transistor 411 is coupled to the input of the inverter. The body of transistor 411 is coupled to the power supply. The source of NMOS transistor 412 is coupled to output 414 of the inverter, while the drain of this transistor is coupled to ground. The gate of transistor 412 is coupled to the input of the inverter. The body of transistor 412 is coupled to ground.

Referring to FIG. 4B, a floating-body inverter 420 also consists of a pair of interconnected transistors, 421 and 422. These transistors are coupled together in the same manner as the transistors of body-tied inverter 410, except that the bodies of the transistors are not coupled to the power supply or to ground. Thus, the input of the inverter 420 is coupled to the gates of both PMOS transistor 421 and NMOS transistor 422. The source of transistor 422 and the drain of transistor 421 are both coupled to the output of the inverter. The source of transistor 421 is coupled to the power supply voltage, while the drain of transistor 422 is coupled to ground.

Referring to FIG. 4C, NAND gate 430 consists of four interconnected transistors. The sources of PMOS transistors 431 and 432 are coupled to the power supply voltage, while the drains of these transistors are coupled to the output of the NAND gate. The gate of transistor 431 is coupled to one of the inputs of NAND gate 430, while the gate of transistor 432 is coupled to the other of the NAND gate's inputs. The source of NMOS transistor 433 is coupled to the output of NAND gate 430, while the drain of transistor 433 is coupled to the source of NMOS transistor 434. The drain of transistor 434 is coupled to ground. The gate of transistor 433 is tied to the gate of transistor 432 and is therefore coupled to the same input of NAND gate 430. The gate the transistor 434 is tied to the gate of transistor 431 and is therefore coupled to the same input of the NAND gate.

The difference between variable-delay circuit 300 and conventional variable-delay circuits is that, where conventional circuits use either floating-body or body-tied transistors, but not both, variable-delay circuit 300 uses a combination of the two different types of SOI transistors. In particular, inverters 311 and 312 and inverters 352 and 353 of circuit 300 are body-tied logic gates, while the remainder of the gates are of the floating-body type. The body-tied logic gates are indicated in the figure by the power supply connection symbols and ground connection symbols extending from the top and bottom, respectively, of the inverter symbols.

As pointed out above, inverters 311, 312, 352 and 353 are among the logic gates that are common to all of the possible signal paths through circuit 300. Thus, all of these inverters add to the "fixed" delay that is imparted by the circuit to the signal. These logic gates are body-tied, so the portion of the delay that corresponds to each of these gates is therefore not subject to the history effect. Although these inverters operate more slowly than comparable floating-body devices, it is not important that each inverter contributes a substantial portion of the delay, because none of these inverters will be switched into or out of the signal path to change the magnitude of the delay. That is, there is no need to provide the fixed to delay in small increments (corresponding to small per-gate delays.)

By contrast, the components that form the variable portion of the possible signal paths through circuit 300 include primarily floating-body logic gates. This is desirable because these components will be selectively switched into and out of the signal path (or, alternatively, the signal being delayed will be selectively routed through particular ones at these components) to provide incremental changes in the total delay. It is therefore acceptable to incur the penalty of small variations in the delays corresponding to individual gates in order to obtain the benefit of small incremental changes in the total delay when these components are added to the signal path through circuit 300.

Figure 5A:
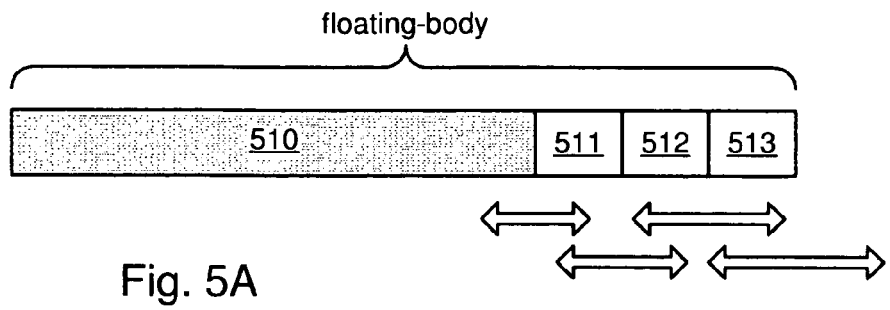
FIGS. 5A–5C are diagrams illustrating the differences in selectable delays between different variable-delay circuits.
Figure 5B:
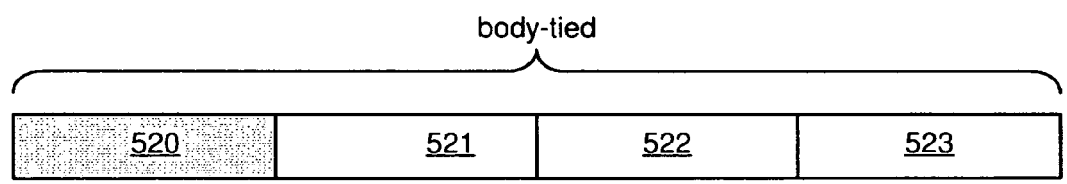
Figure 5C:
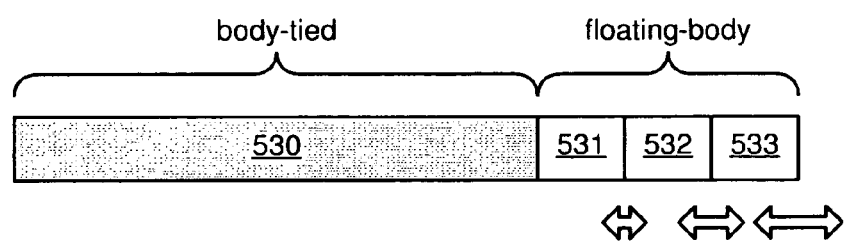

The functional differences between variable-delay circuit 300 and conventional circuits is illustrated in FIGS. 5A–5C. FIGS. 5A–5C are diagrams illustrating the differences in selectable delays between a circuit that uses all floating-body SOI transistors (FIG. 5A,) a circuit that uses all body-tied SOI transistors (FIG. 5B) and a circuit that uses a combination of floating-body and body-tied SOI transistors such as circuit 300 (FIG. 5C.) Each of the figures illustrates a set of four possible delays that can be imparted to a signal that is processed by a corresponding circuit.

Referring to FIG. 5A, the selectable delays of a variable-delay circuit that uses all floating-body SOI transistors is shown. At the left side of FIG. 5A is a shaded block, 510, that represents the fixed delay in the corresponding circuit. Every signal that is processed by the all-floating-body delay circuit is delayed by at least this minimum, fixed amount of time. Each of blocks 511–513 represents an incremental delay that can be added to the fixed delay. Thus, a signal can be selectively delayed by either the fixed delay (510,) the fixed delay plus one incremental delay (510+511,) the fixed delay plus two incremental delays (510+ 511+512,) or the fixed delay plus all three incremental delays (510+511+512+ 513.)

As noted above, the variable-delay circuit corresponding to FIG. 5A is constructed using all floating-body SOI transistors. The portion of the circuit that imparts the fixed portion of the delay is therefore constructed using floating-body transistors. Consequently, the fixed portion, 510, of the total delay is subject to variations arising from the history effect. These variations are represented in the figure by the double-ended arrow below the right-hand edge of delay 510. Thus, even if the minimum delay of the circuit is selected, there will be some variations in the length of the delay.

As the next longer delay is selected, additional logic gates are added to the signal path (the path traversed between the input and the output of the circuit.) These logic gates, like the gates in the portion of the circuit corresponding to the fixed delay, are constructed using floating-body SOI transistors. The delays imparted by the additional gates are therefore also subject to variations resulting from the history effect. Each successive path adds the same number and type of logic gates to the signal path, and also adds uncertainty to the length of the total delay. The variation in the total delay is cumulative with the incremental increases in the delay. The total variation is represented by the double-ended arrows below the right-hand edges of the blocks representing the additional incremental delays (511–513.) The possible variations resulting from the history effect can be great enough that they significantly impact the system in which the delayed signal is used, and may even cause the system to malfunction.

Referring to FIG. 5B, the selectable delays of a circuit that uses all body-tied SOI transistors is shown. Again, the fixed portion of the delay is shown as a shaded block (520,) while the incremental portions of the delay are shown as non-shaded blocks (521–523.) The signals that are processed by the circuit corresponding to FIG. 5B are selectably delayed by either the fixed delay alone (520,) or with one or more of the incremental delays (520+521, 520+521+522, or 520+521+522+523.)

Because the circuit corresponding to FIG. 5B is constructed using all body-tied SOI transistors, it is not subject to the history effect. The delays illustrated in FIG. 5B therefore have no variations resulting from the history effect. Accordingly, no arrows are shown below the fixed or incremental delays.

While the delays in the all-body-tied circuit do not have history effect variations, this comes at the expense of speed. As explained above, the body-tied components operate more slowly than their floating-body counterparts. The delay produced by a body-tied component is therefore greater (typically about three times greater) than the delay of a comparable floating-body component. Thus, while the length of the delay selected in the body-tied circuit is known more precisely, it cannot be adjusted in increments that are as small as the increments in the floating-body circuit. The larger increments are apparent in FIG. 5B (as compared to FIG. 5A.)

Referring to FIG. 5C, the selectable delays corresponding to any circuit that uses a combination of body-tied and floating-body transistors is shown. The fixed portion of the delay is represented by shaded block 530. The incremental increases in the total delay are represented by unshaded blocks 531–533. Signals that are processed by the variable-delay circuit corresponding to FIG. 5C can be selectively delayed by either the fixed delay alone (530,) or by the fixed delay and one or more additional, incremental delays (i.e., 530+531, 530+531+532, or 530+531+532+533.)

In the circuit corresponding to FIG. 5C, the portion of the circuit corresponding to the fixed delay is constructed using body-tied transistors. This eliminates the history effect from this portion of the delay. Thus, if the minimum delay (the fixed delay) of the circuit is selected, the delay will not be subject to variations arising from the history effect. Because the fixed portion of the delay is typically desired to be quite a bit larger than the incremental increases in the variable delay, the slow speed of the body-tied transistors does not produce any unwanted effects.

The portion of the circuit corresponding to the incremental increases in the delay of FIG. 5C is constructed using floating-body transistors. While this portion of the circuit is subject to the history effect, the resulting variations in the incremental delays may be acceptable, since they are not added to existing variations in the fixed portion of the delay (because these variations are eliminated through the use of body-tied transistors in that portion of the circuit.) Thus, if a delay consisting of the fixed delay and one incremental delay is selected, the variation in the total delay will only be the variation associated with the small, incremental delay. The variations will therefore be small in comparison with the variations of an all-floating-body circuit (as illustrated in figure of 5A.)

The variable-delay circuit using a combination of floating-body and body-tied transistors (and logic gates) therefore maximizes the advantages of the all-body-tied circuit and the all-floating-body circuit, while minimizing their respective disadvantages. That is, the combination of the two different types of transistors provides fine-grained control of the total delay (i.e., small incremental increases to the total delay,) while eliminating a substantial portion of the variations in the total delay and (by eliminating the history effect in the fixed portion of the delay.)

The variable-delay circuit illustrated in FIG. 3 and described in detail above is intended to be exemplary of the various embodiments of the invention. Many variations are possible in alternative embodiments. For example, circuit 300 does not exclusively use body-tied gates for the portion of the circuit corresponding to the fixed delay. In other words, while body-tied inverters 311, 312, 352 and 353 form most of the fixed signal path, NAND gate 351 is also part of the fixed signal path, but this logic gate is a floating-body gate in the embodiment of FIG. 3. In an alternative embodiment, NAND gate 351 could be replaced by a body-tied NAND gate. This would further reduce variations in the total delay produced by the circuit. It should be noted, however, that this would also increase the fixed portion of the delay by slowing down the response of this gate. This increase in the fixed portion of the delay may or may not be acceptable for a given application. It should likewise be noted that NAND gates 321, 322, 323 and 351 could be considered part of the fixed signal path. Even though only one of these NAND gates will be in a signal path at any given time, one of them will always be in the signal path. Therefore, all of these NAND gates could be replaced by body-tied gates. This would provide reduced delay variations and an increased fixed delay as described above, although differences in the individual responses of NAND gates 321–323 could also introduce some delay variations between the different signal paths.

In addition to the alternative embodiments in which more or fewer of the logic gates are implemented using body-tied transistors, there are embodiments of the invention that may have entirely different structures. These alternative embodiments may have more or fewer selectable delays (and corresponding signal paths,) they may have different logic gates or other components, or they may vary in other ways from the embodiments described herein. All of these embodiments are contemplated to be within the scope of the invention as defined by the claims below.

Those of skill in the art will understand that information and signals may be represented using any of a variety of different technologies and techniques. For example, data, instructions, commands, information, signals, bits, symbols, and chips that may be referenced throughout the above description may be represented by voltages, currents, or the like. The information and signals may be communicated between components using any suitable transport media, including wires, metallic traces, vias, and so on.

Those of skill will further appreciate that the various illustrative logical blocks, modules, circuits, and algorithm steps described in connection with the embodiments disclosed herein may, in some embodiments, be implemented as electronic hardware, computer software, or combinations of both. To illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with general purpose processors, digital signal processors (DSPs) or other logic devices, application specific integrated circuits (ASICs), field programmable gate arrays (FPGAs), discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

What is claimed is:

1. A variable-delay circuit comprising:
   a plurality of silicon-on-insulator (SOI) logic gates;
   wherein the logic gates are configured to form a plurality of selectable signal paths;
   wherein a first subset of the logic gates is common to each of the signal paths;
   wherein a second subset of the logic gates is included in one or more selectable portions of the signal paths;
   wherein the first subset includes one or more body-tied logic gates; and
   wherein the second subset includes one or more floating-body logic gates.

2. The circuit of claim 1, wherein the first subset includes more body-tied logic gates than floating-body logic gates.

3. The circuit of claim 2, wherein the first subset includes only body-tied logic gates.

4. The circuit of claim 1, wherein the second subset includes more floating-body logic gates than body-tied logic gates.

5. The circuit of claim 4, wherein the second subset includes only floating-body logic gates.

6. The circuit of claim 1, wherein the plurality of signal paths are alternately selectable.

7. The circuit of claim 6, wherein each successive signal path includes the preceding signal path.

8. The circuit of claim 7, wherein each successive signal path routes the signal through one or more additional logic gates.

9. The circuit of claim 8, wherein the additional logic gates through which the signal is routed in each successive signal path are the same number and type for each successive signal path.

10. A variable-delay circuit comprising:
    a plurality of silicon-on-insulator (SOI) transistors;
    wherein the transistors are configured to form one or more signal paths to delay a signal by a selectable amount of time;
    wherein a first subset of the transistors provides a fixed portion of the selectable amount of time;
    wherein a second subset of the transistors provides a variable portion of the selectable amount of time;
    wherein the first subset includes one or more body-tied transistors; and
    wherein the second subset includes one or more floating-body transistors.

11. The circuit of claim 10, wherein the one or more signal paths comprise a plurality of signal paths that are alternately selectable.

12. The circuit of claim 11, wherein each of the plurality of signal paths includes a first portion that is common to all of the signal paths and a second portion that is selectable.

13. The circuit of claim 12, wherein the plurality of signal paths provide delays of corresponding amounts of time, wherein the delay of each successive signal path is greater than the delay of a preceding signal path by an incremental amount of time.

14. The circuit of claim 13, wherein each successive signal path includes the preceding signal path.

15. The circuit of claim 14, wherein each successive signal path routes the signal through additional circuitry that adds the incremental amount of time to the delay of the preceding signal path.

16. The circuit of claim 10, wherein the first subset includes more body-tied transistors than floating-body transistors.

17. The circuit of claim 16, wherein the first subset includes only body-tied transistors.

18. The circuit of claim 10, wherein the second subset includes more floating-body transistors than body-tied transistors.

19. The circuit of claim 18, wherein the second subset includes only floating-body transistors.

* * * * *